US009406620B2

(12) United States Patent
Yamanishi

(10) Patent No.: US 9,406,620 B2
(45) Date of Patent: Aug. 2, 2016

(54) SEMICONDUCTOR PACKAGE

(75) Inventor: Norio Yamanishi, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 470 days.

(21) Appl. No.: 13/483,464

(22) Filed: May 30, 2012

(65) Prior Publication Data
US 2012/0313265 A1    Dec. 13, 2012

(30) Foreign Application Priority Data
Jun. 9, 2011    (JP) .................................. 2011-129230

(51) Int. Cl.
| *H01L 23/544* | (2006.01) |
| *H01L 25/10* | (2006.01) |
| *H01L 25/00* | (2006.01) |
| H01L 23/00 | (2006.01) |
| H01L 25/065 | (2006.01) |
| H01L 23/498 | (2006.01) |

(52) U.S. Cl.
CPC ............ *H01L 23/544* (2013.01); *H01L 25/105* (2013.01); *H01L 25/50* (2013.01); *H01L 23/49811* (2013.01); *H01L 24/16* (2013.01); *H01L 24/32* (2013.01); *H01L 24/48* (2013.01); *H01L 24/73* (2013.01); *H01L 24/92* (2013.01); *H01L 25/0657* (2013.01); *H01L 2224/16225* (2013.01); *H01L 2224/16237* (2013.01); *H01L 2224/16238* (2013.01); *H01L 2224/32145* (2013.01); *H01L 2224/32225* (2013.01); *H01L 2224/48091* (2013.01); *H01L 2224/48227* (2013.01); *H01L 2224/48229* (2013.01); *H01L 2224/73204* (2013.01); *H01L 2224/73265* (2013.01); *H01L 2224/81444* (2013.01); *H01L 2224/81455* (2013.01); *H01L 2224/83102* (2013.01); *H01L 2224/85444* (2013.01); *H01L 2224/85455* (2013.01); *H01L 2224/92125* (2013.01); *H01L 2225/0651* (2013.01); *H01L 2225/06517* (2013.01); *H01L 2225/06558* (2013.01); *H01L 2225/06568* (2013.01); *H01L 2225/1023* (2013.01); *H01L 2225/1058* (2013.01); *H01L 2924/12042* (2013.01);
(Continued)

(58) Field of Classification Search
CPC ...................................................... H01L 23/544
USPC ......................................................... 257/797
See application file for complete search history.

(56) References Cited

U.S. PATENT DOCUMENTS

2002/0140107 A1    10/2002    Kato et al.
2004/0201097 A1 *  10/2004    Ohsumi ......................... 257/737
(Continued)

FOREIGN PATENT DOCUMENTS

| JP | 2003-318359 | 11/2003 |
| JP | 2004-319638 | 11/2004 |

(Continued)

OTHER PUBLICATIONS

Notification of Reasons for Rejection; JP Appln. No. 2011-129230; Sep. 24, 2014; 3pp (with translation (2pp).

*Primary Examiner* — Samuel Gebremariam
(74) *Attorney, Agent, or Firm* — Fish & Richardson P.C.

(57) ABSTRACT

A semiconductor package includes a plurality of connection pads, which are electrically connected to connection terminals of a mounted component that is mounted on the semiconductor package, and recognition marks. The recognition marks are formed respectively within the area of each of at least two of the connection pads. Each recognition mark has an area that is smaller than the area of the connection mark in which it is formed.

14 Claims, 9 Drawing Sheets

(52) U.S. Cl.
CPC ............... *H01L2924/15311* (2013.01); *H01L 2924/15331* (2013.01)

(56) References Cited

U.S. PATENT DOCUMENTS

2005/0161794 A1  7/2005  Kato et al.
2006/0226529 A1  10/2006  Kato et al.
2008/0088038 A1*  4/2008  Hsu et al. .................... 257/786
2008/0284048 A1*  11/2008  Kim et al. ................... 257/797

FOREIGN PATENT DOCUMENTS

JP   2008-147472   6/2008
JP   2009-146969   7/2009
WO   WO 02/082540  10/2002

* cited by examiner

SEMICONDUCTOR PACKAGE

CROSS-REFERENCE TO RELATED APPLICATIONS

This application is based upon and claims the benefit of priority from prior Japanese Patent Application No. 2011-129230, filed on Jun. 9, 2011, the entire contents of which are incorporated herein by reference.

FIELD

The present invention relates to a semiconductor package.

BACKGROUND

As a structure for stacking semiconductor packages, a so-called PoP (Package On Package) structure is known. Recently, downsizing of a semiconductor package is advanced, and wiring patterns and connection pads formed in a semiconductor package are miniaturized. As a result, it has become difficult to provide space for a recognition mark (e.g., alignment mark or product identification mark) for positioning a semiconductor package, between wiring patterns or connection pads.

When a mounted semiconductor package is mounted on a mounting semiconductor package, to recognize the location of the mounting semiconductor package, certain connection pads may have a shape that differs from that of other connection pads. Such a differently shaped connection pad functions as a recognition mark (for example, refer to Japanese Laid-Open Patent Publication Nos. 2009-146969 and 2008-147472). As illustrated in FIG. 9, a mounting semiconductor package 90 includes circular connection pads 91 and tetragonal connection pads 92. This allows the tetragonal connection pads 92 to be distinguished from the circular connection pads 91. When, for example, a mounting apparatus mounts another semiconductor package (not illustrated) onto the semiconductor package 90, a camera or the like of the mounting apparatus detects the locations of the tetragonal connection pads 92 (recognition marks) to position the two semiconductor packages.

SUMMARY

However, electronic devices have become smaller and thinner. This has resulted in a demand for semiconductor packages that are further miniaturized and have a higher density. Such high wire density imposes limitations on the shapes of the connection pads. For example, when the connection pads are tetragonal, the corners of the tetragonal connection pads obstruct the densification of wires. Thus, in a semiconductor package having a high wire density, tetragonal connection pads cannot be formed. This makes it difficult to recognize connection pads when relying on the different planar shapes of the connection marks.

One aspect of the present invention is a semiconductor package including a plurality of connection pads electrically connected to connection terminals of a mounted component that is mounted on the semiconductor package. A recognition mark is formed in each of at least two of the connection pads. Each recognition mark has an area less than an area of the corresponding connection pad.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EMBODIMENTS

One embodiment of the present invention will now be described with reference to the accompanying drawings. The accompanying drawings schematically illustrate structures and do not depict actual scale.

One embodiment will now be described with reference to FIGS. 1 to 7. FIG. 4 illustrates a semiconductor device 70 having a PoP structure. The semiconductor device 70 includes a lower package 1 and an upper semiconductor package 50 mounted on the lower package 1. The lower package 1 may be referred to as a first or mounting semiconductor package. The upper package 50 may be referred to as a second or mounted semiconductor package or a mounted component.

Configuration of Lower Package

Figure 1A:
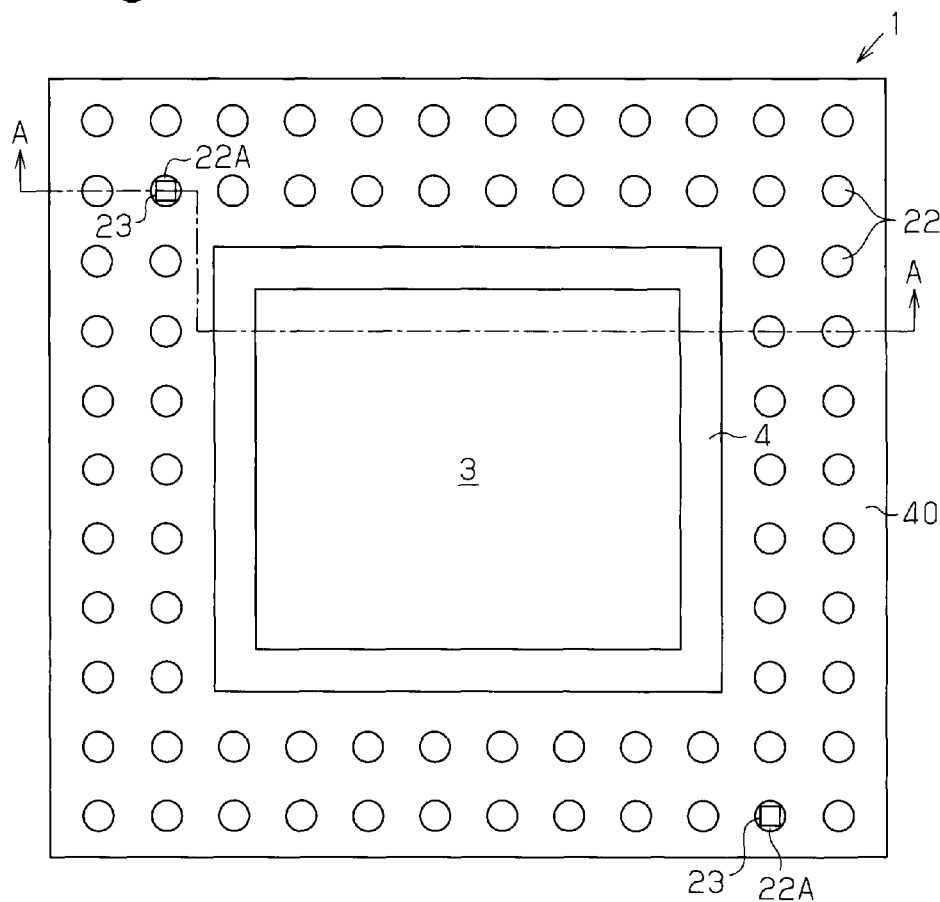
FIG. 1A is a schematic plan view illustrating a lower package.
Figure 1B:
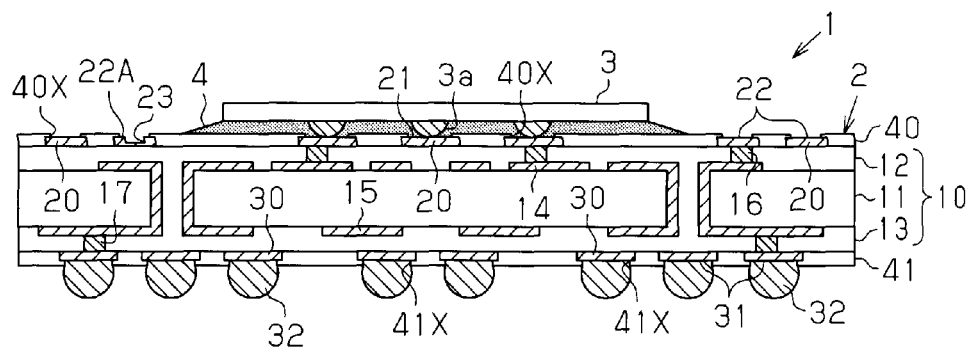
FIG. 1B is a cross-sectional view of the lower package taken along line A-A in FIG. 1A.

As illustrated in FIG. 1B, the lower package 1 includes a wiring board 2, a semiconductor element 3, and an underfill resin 4. The semiconductor element 3 is flip-chip-mounted on the wiring board 2. The underfill resin 4 fills the gap between the wiring board 2 and the semiconductor element 3.

The wiring board 2 includes a substrate 10, a wiring pattern 20 in an uppermost layer, a wiring pattern 30 in a lowermost layer, and solder resist layers 40 and 41.

The substrate 10 includes a core substrate 11, insulative layers 12 and 13, wires 14 and 15, and vias 16 and 17. The wires 14 and 15 and the vias 16 and 17 are formed in the insulative layers 12 and 13, respectively. Further, the wires 14 and 15 and the vias 16 and 17 electrically connect the wiring patterns 20 and 30. Copper (Cu), for example, may be used as the material of the wires 14 and 15 and the vias 16 and 17. Insulative resins, such as epoxy resin or polyimide resin, may be used as the material of the insulative layers 12 and 13.

The wiring pattern 20 is arranged in a mounting surface side (upper surface side as viewed in FIG. 1B) of the substrate 10. The wiring pattern 20 includes semiconductor element pads 21, which are electrically connected to bumps 3a of the semiconductor element 3, and connection pads 22, which electrically connect the lower package 1 and the upper package 50 (refer to FIG. 3). A plan view would illustrate the semiconductor element pads 21 are arranged in a matrix array in a mounting region to which the semiconductor element 3 is mounted. The planar shape of each semiconductor element pad 21 is, for example, circular.

Figure 2:
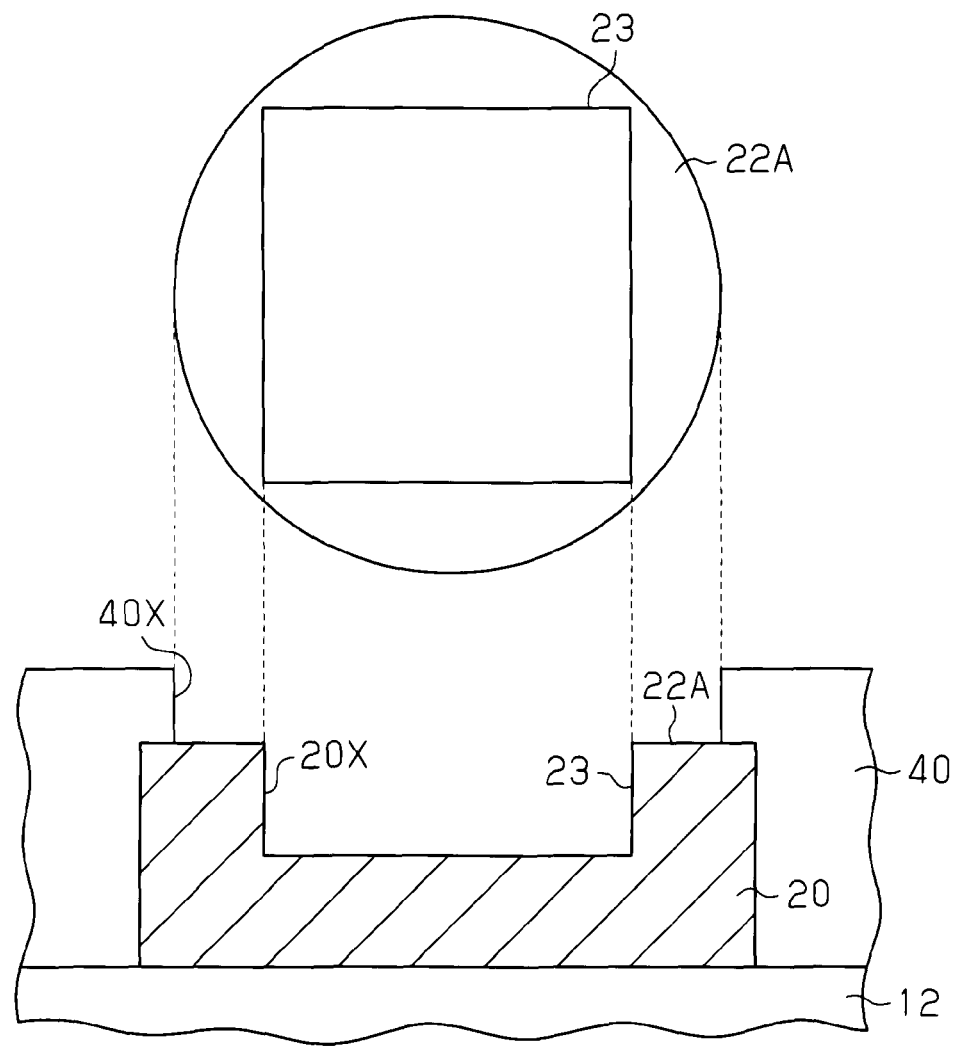
FIG. 2 is a schematic plan view and schematic cross-sectional view illustrating a connection pad and a recognition mark.
Figure 3A:
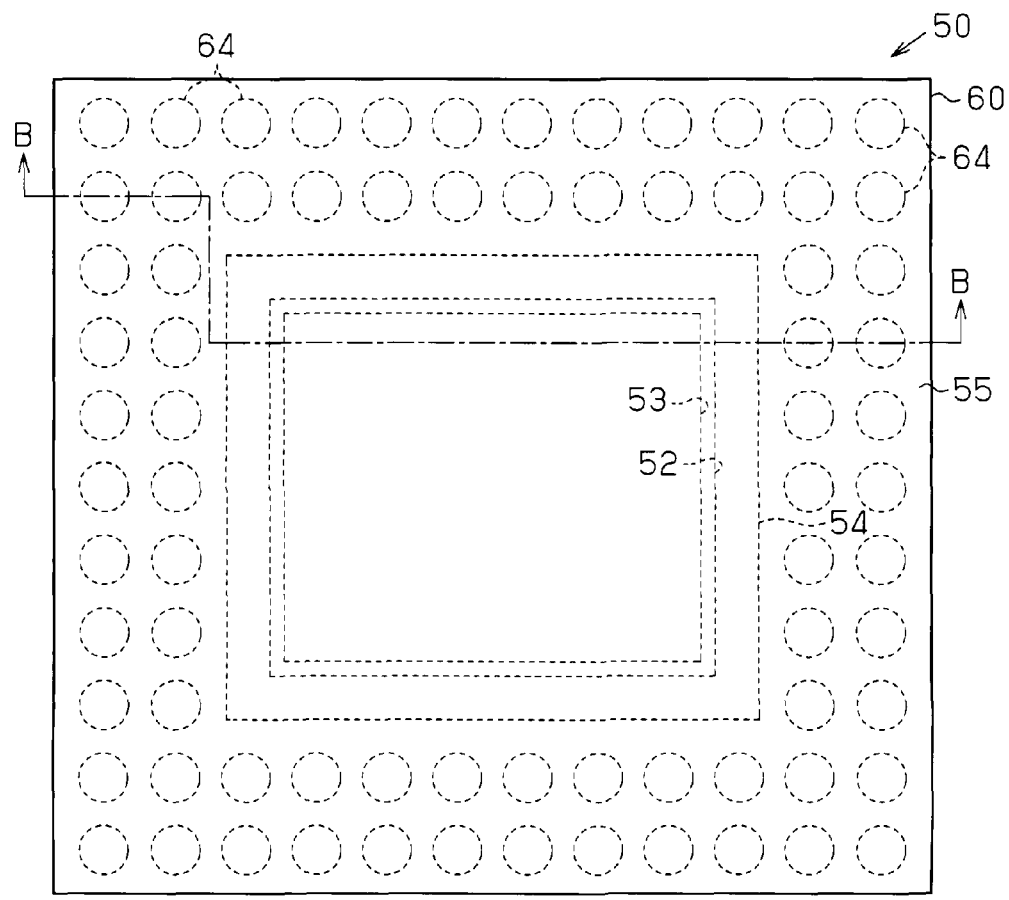
FIG. 3A is a schematic plan view illustrating an upper package.

As illustrated in FIG. 1A, the connection pads 22 of the present embodiment are arranged in two rows encompassing the periphery of the semiconductor element 3. The planar shape of each connection pad 22 is, for example, circular and has a diameter of 240 to 250 μm. Further, a recognition mark 23 is formed in each of at least two of the connection pads 22, namely, connection pads 22A. Each recognition mark 23 has an area smaller than that of the corresponding connection pad 22A as viewed from above. The two connection pads 22A function not only as terminals that electrically connect the lower package 1 and the upper package 50 (refer to FIG. 3) but also as a recognition mark, such as a alignment mark or product identification mark used when mounting an upper package. By ensuring the distance between the connection pads 22A including the recognition marks 23, the recognition mark function of the connection pads 22A can be improved. Thus, the recognition marks 23 are arranged on a diagonal line of the lower package 1. As illustrated in FIG. 2, the planar shape of each recognition mark 23 is tetragonal and shaped differently from the connection pad 22A. The recognition mark 23 may be a recess 20X, which is formed in a part of the wiring pattern 20 as the connection pad 22A. More specifically, a boundary (or step) between the side wall of the tetragonal recess 20X and the upper surface of the connection pad 22A forms the profile of the recognition mark 23. The recess 20X may be formed by, for example, an etching process (half etching) or a pressing process. The connection pads 22A may be referred to as marked connection pads. The connection pads 22 other than the connection pads 22A may be referred to as non-marked connection pads.

For example, copper may be used as the material of the wiring pattern 20. Further, a certain plating (e.g., nickel plating or gold plating) may be applied to the surface of a copper layer.

As illustrated in FIG. 1B, the solder resist layer 40 is arranged in the upper surface side of the substrate 10 to cover parts of the wiring pattern 20. For example, an insulative resin such as epoxy resin may be used as the material forming the solder resist layer 40. The solder resist layer 40 includes a plurality of openings 40X, which expose parts of the wiring pattern 20 that form the semiconductor element pads 21 or the connection pads 22. In a state before the underfill resin 4 is formed, parts of the wiring pattern 20, which serve as the semiconductor element pads 21 and the connection pads 22, are exposed from the solder resist layer 40 through the openings 40X. In the present embodiment, the openings 40X each have a circular planar shape so that the semiconductor element pads 21 and the connection pads 22 can be formed with the desired shapes.

The wiring pattern 30 is arranged in the lower surface side of the substrate 10. The wiring pattern 30 includes external connection pads 31. External connection terminals 32, such as solder balls or lead pins, are arranged on the external connection pads 31 and used to mount a mounting substrate, such as a motherboard, on the lower package 1. Parts of the wiring patterns 30 are exposed through openings 41X in the solder resist layer 41 formed in the lower surface side of the substrate 10 to form the external connection pads 31. For example, copper may be used as the material of the wiring pattern 30. Further, the wiring pattern 30 may be formed by applying a certain plating (e.g., nickel plating or gold plating) to the surface of a copper layer. For example, an insulative resin such as epoxy resin may be used as the material of the solder resist layer 41.

The semiconductor element 3 is flip-chip-connected to the wiring board 2. That is, the semiconductor element 3 is electrically connected to the semiconductor element pads 21 of the wiring board 2 by the bumps 3a, which are arranged on a circuit formation surface (lower surface as viewed in FIG. 1B) of the semiconductor element 3.

The underfill resin 4 fills the gap between the upper surface of the wiring board 2 and the lower surface of the semiconductor element 3. The underfill resin 4 increases the coupling strength where the bumps 3a and semiconductor element pads 21 are coupled. Further, the underfill resin 4 suppresses corrosion of the wiring pattern 20 and the generation of electromigration. The underfill resin 4 also improves the reliability of the wiring pattern 20. For example, an insulative resin such as an epoxy resin may be used as the material of the underfill resin 4.

Configuration of Upper Package

The configuration of the upper package 50 will now be described.

Figure 3B:
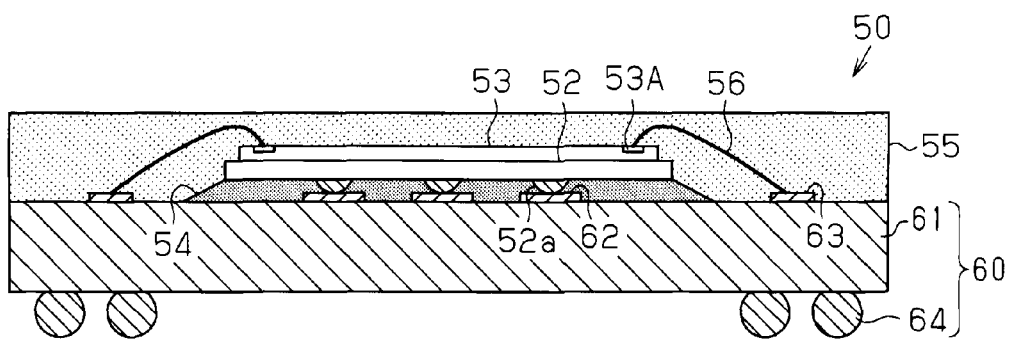
FIG. 3B is a schematic plan view of the upper package taken along line B-B in FIG. 3A.
Figure 4:
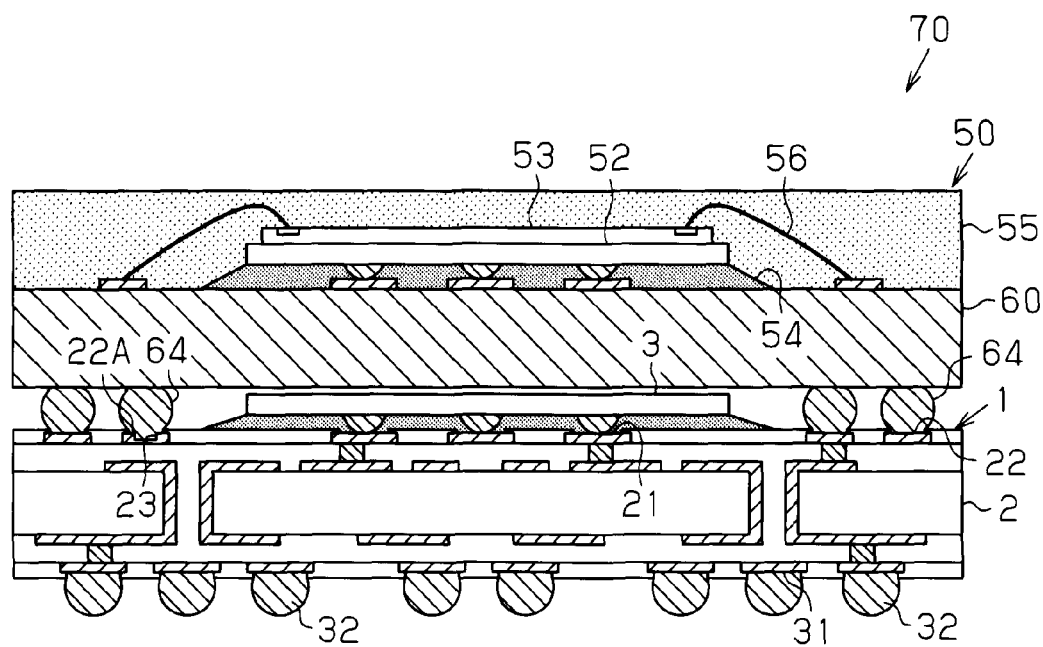
FIG. 4 is a schematic cross-sectional view of the semiconductor device.

As illustrated in FIG. 3B, the upper package 50 includes a wiring board 60, a first semiconductor element 52 flip-chip-mounted on the wiring board 60, and a second semiconductor element 53, which is adhered onto the first semiconductor element 52. Further, the upper package 50 includes an underfill resin 54, which fills the gap between the first semiconductor element 52 and the wiring board 60, and a molding resin 55, which seals the first semiconductor element 52, the second semiconductor element 53, and the like. Referring to FIG. 3A, the first semiconductor element 52 is larger than the second semiconductor element 53 as viewed from above.

As illustrated in FIG. 3B, the wiring board 60 includes a substrate 61, semiconductor element pads 62, bonding pads 63, and external connection terminals 64. The semiconductor element pads 62 and the bonding pads 63 are formed on the upper surface of the substrate 61. The external connection terminals 64 are formed on the lower surface of the substrate 61.

Although not illustrated in the drawings, the substrate 61 includes a plurality of insulative layers. Vias, wires, and the like are formed in the insulative layers. The vias and wires of the substrate 61 are electrically connected to the semiconductor element pads 62, the bonding pads 63, and the external connection terminals 64. For example, a coreless substrate, a buildup substrate including a core substrate, and the like may be used as the substrate 61.

Bumps 52a of the first semiconductor element 52 are flip-chip-connected to the semiconductor element pads 62. Further, the bonding pads 63 are electrically connected to electrode pads 53A formed on the upper surface of the second semiconductor element 53. For example, copper may be used as the material of the semiconductor element pads 62 and the bonding pads 63. Further, the semiconductor element pads 62 and the bonding pads 63 may be formed by applying a certain plating (e.g., nickel plating or gold plating) to a copper layer.

External connection terminals 64, such as solder balls or lead pins, connect the upper package 50 and the lower package 1 (refer to FIG. 1). The external connection terminals 64 are arranged to face the connection pads 22 and 22A of the lower package 1 (refer to FIG. 1). That is, as illustrated in FIG.

3A, the external connection terminals 64 are arranged in two rows along the periphery of the wiring board 60.

Referring to FIG. 3B, the underfill resin 54 is used to improve the coupling strength where the bumps 52a of the first semiconductor element 52 are coupled with the semiconductor element pads 62. The underfill resin 54 fills the gap between the upper surface of the wiring board 60 and the lower surface of the first semiconductor element 52. For example, an insulative resin such as epoxy resin may be used as the material of the underfill resin 54.

The molding resin 55 is arranged over the upper surface of the substrate 61 to seal the first semiconductor element 52, the second semiconductor element 53, the bonding wires 56, the bonding pads 63, and the like. For example, an insulative resin such as epoxy resin may be used as the material of the molding resin 55. For example, a transfer molding process may be used to perform the sealing.

Configuration of Semiconductor Device

The configuration of the semiconductor device 70 will now be described.

As illustrated in FIG. 4, the semiconductor device 70 includes the lower package 1 and the upper package 50, which is stacked on and connected to the lower package 1.

The connection pads 22 and 22A, which are formed on the upper surface of the lower package 1, are coupled with the external connection terminals 64, which are formed on the lower surface of the upper package 50. This stacks and connects the lower package 1 and the upper package 50 and forms the semiconductor device 70, which has a PoP structure.

Operation of Semiconductor Device

The operation of the semiconductor device 70 (particularly, the lower package 1) will now be described.

In the lower package 1 of the semiconductor device 70, the recognition marks 23 are formed in at least two of the connection pads 22. The recognition marks 23 each have an area as viewed from above that is smaller than that of the corresponding connection pad 22A. As a result, each connection pad 22A, which functions as a terminal connecting the lower package 1 and the upper package 50, is provided with a recognition mark function. Thus, there is no need to provide space dedicated for a recognition mark. Further, each recognition mark 23 is formed within the region of the corresponding connection pad 22A. Thus, each connection pad 22A may have a circular planar shape like the other connection pads 22. That is, the connection pads 22A having a recognition mark function may be formed to have a planar shape (e.g., circular shape) allowing for application to highly dense wires.

Method for Manufacturing Semiconductor Device

Figure 5A:
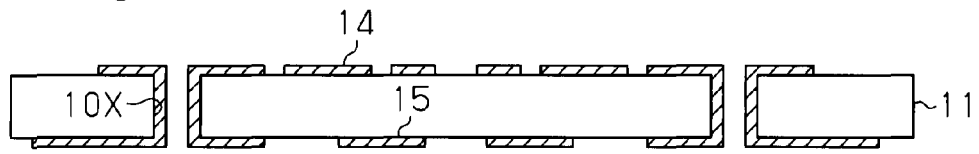
FIGS. 5A to 5E are schematic cross-sectional views illustrating the procedures for manufacturing the lower package.

A method for manufacturing the lower package 1 will now be described. The manufacturing method of the lower package 1 illustrated in FIGS. 5 and 6 uses the core substrate 11, which is illustrated in FIG. 5A. The core substrate 11 is fabricated, for example, by forming through holes 10X in a copper clad laminate (CCL) and plating the walls of the through holes 10X to electrically connect the two opposite surfaces of the CCL. Then, a subtractive process is performed to form the wires 14 and 15.

Figure 5B:
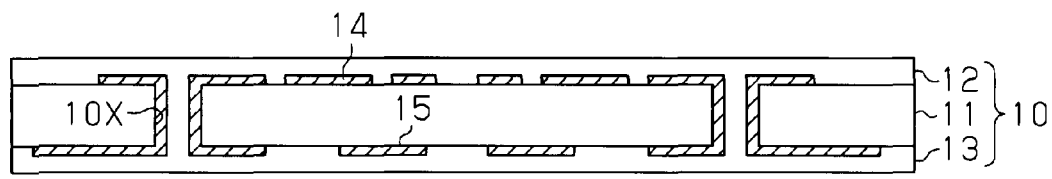
Figure 5C:
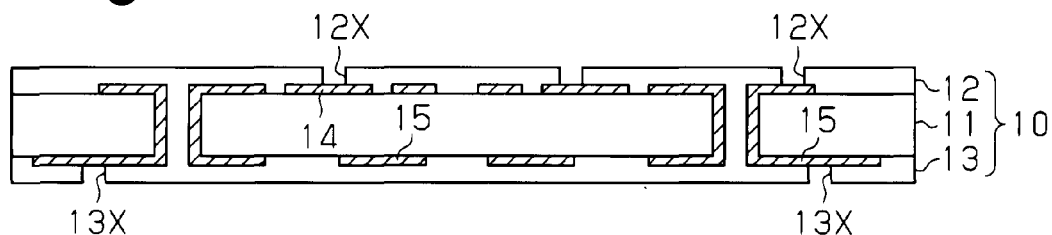
Figure 5D:
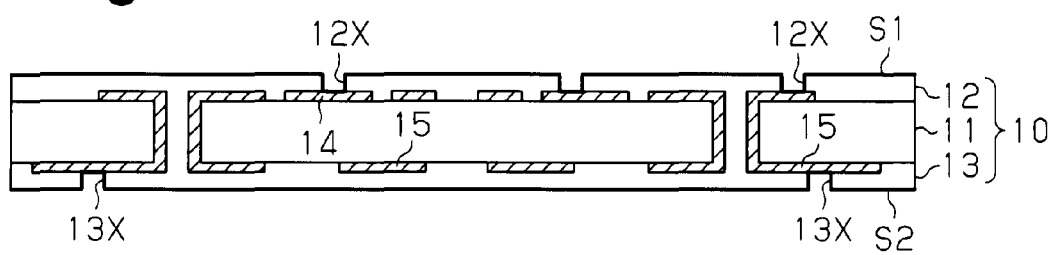

Referring to FIG. 5B, the insulative layers 12 and 13 are formed in the upper and lower surface sides of the core substrate 11. Next, referring to FIG. 5C, openings 12X and 13X are formed at predetermined locations in the insulative layers 12 and 13. The openings 12X and 13X may be formed by, for example, a laser process.

Subsequently, a desmear process is performed. Then, referring to FIG. 5D, a seed layer S1 is formed to cover the insulative layer 12 and the wires 14, and a seed layer S2 is formed to cover the insulative layer 13 and the wires 15. Electroless copper plating or sputtering is performed to form the seed layers S1 and S2.

Figure 5E:
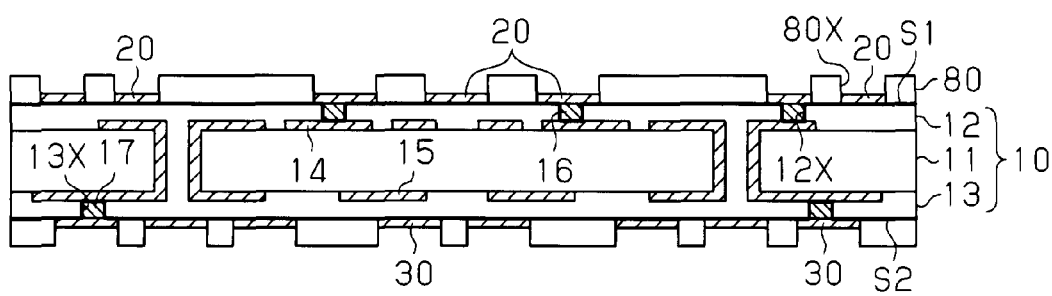

Next, referring to FIG. 5E, the wiring patterns 20 and 30 and the vias 16 and 17 are formed by, for example, a semi-additive process. More specifically, a photolithography process is performed to form a dry film resist (DFR) 80, which includes an opening pattern 80X corresponding to the shape of the wiring pattern 20, on the seed layer S1. Further, electrolytic plating using the seed layer S1 as a power feeding layer is performed to form the wiring pattern 20 and the vias 16. The wiring pattern 30 and the vias 17 are formed in the same manner as the wiring pattern 20 and the vias 16.

Figure 6A:
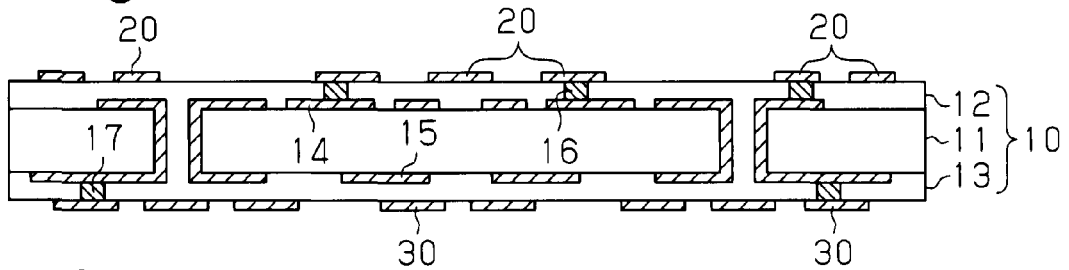
FIGS. 6A to 6E are schematic cross-sectional views illustrating the procedures for manufacturing the lower package.

When the wiring patterns 20 and 30 and the vias 16 and 17 are formed, referring to FIG. 6A, the DFR 80 and the unnecessary seed layers S1 and S2 are removed.

Figure 6B:
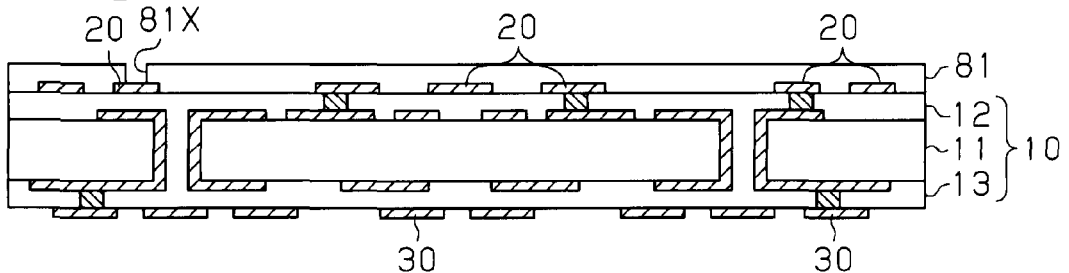

Next, referring to FIG. 6B, a resist layer 81, which includes openings 81X shaped in correspondence with the recognition marks 23 (refer to FIG. 2), is formed over the upper surface of the insulative layer 12. For example, after the resist layer 81 is formed to cover the wiring pattern 20 and the insulative layer 12, a photolithography process is performed to expose and develop the resist layer 81 and form the openings 81X, which expose parts of the upper surface of the wiring pattern 20. In the illustrated embodiment, the openings 81X each have a tetragonal planar shape. The material of the resist layer 81 is not particularly limited as long as it has the desired resolution and is etching resistant.

Figure 6C:
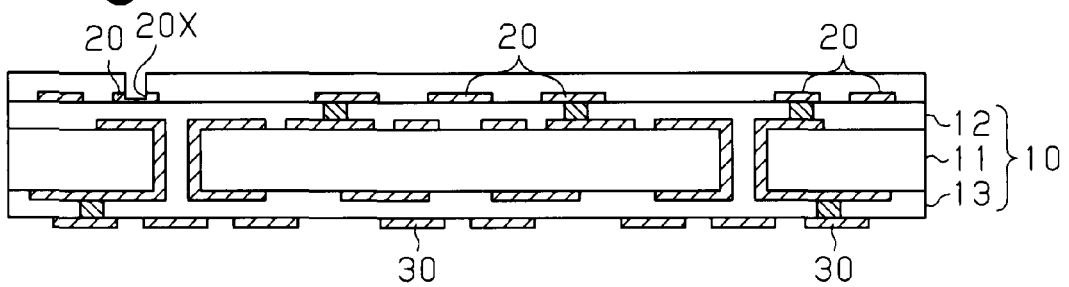

Then, referring to FIG. 6C, half-etching is performed, using the resist layer 81 as an etching mask, on portions of the wiring pattern 20 exposed from the openings 81X. This reduces the thickness of the wiring pattern 20 at such portions as the half-etching removes the wiring pattern 20. This forms recesses 20X at the portions of the wiring pattern 20 exposed from the openings 81X. The etching liquid used in this process may be selected in accordance with the material of the wiring pattern 20. For example, when copper is used for the wiring pattern 20, aqueous ferric chloride may be used as the etching liquid. Such an etching process (half-etching) can be performed to form the recesses 20X. Instead, a pressing process may be performed to form the recesses 20X.

After the formation of the recesses 20X, for example, ashing is performed to remove the resist layer 81.

Figure 6D:
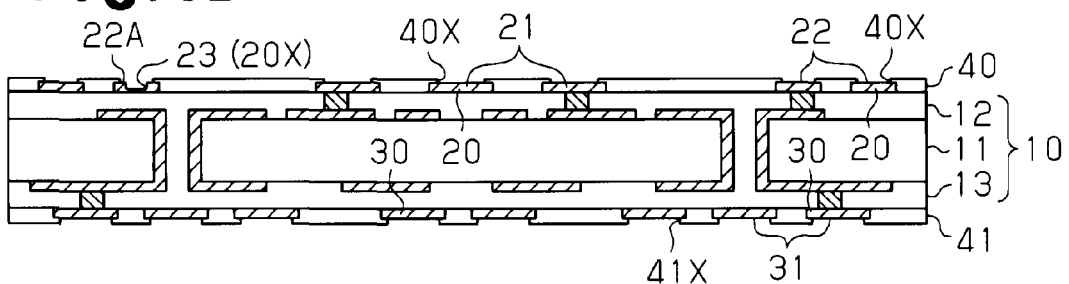

Next, referring to FIG. 6D, the solder resist layer 40, which includes the openings 40X that expose parts of the upper surface of the wiring pattern 20, is formed over the insulative layer 12. For example, after forming the solder resist layer 40 to cover the wiring pattern 20 and the insulative layer 12, a photolithography process is performed to expose and develop the solder resist layer 40 and form the openings 40X, which expose parts of the upper surface of the wiring pattern 20. The openings 40X each are formed with larger area, as viewed from above, than the openings 81X of the resist layer 81. The openings 40X expose parts of the wiring pattern 20 from the solder resist layer 40 as the semiconductor element pads 21 and the connection pads 22 and 22A. Here, the recesses 20X of the connection pads 22A are entirely exposed from the corresponding openings 40X, and the recesses 20X form the recognition marks 23.

Figure 6E:
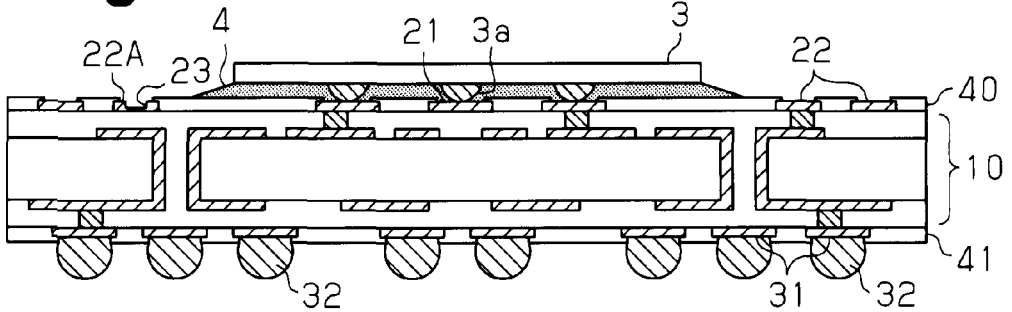

Then, referring to FIG. 6E, the external connection terminals 32 are formed on the external connection pads 31. For example, after the application of a flux, the external connection terminals 32 (i.e., solder balls) are mounted on the external connection pads 31. A reflow process is performed under the temperature of approximately 240° C. to 260° C. Then, the flux is washed away and removed from the surface of the external connection terminals 32.

Subsequently, the semiconductor element 3 is mounted on the wiring board 2. More specifically, the bumps 3a of the semiconductor element 3 are flip-chip-connected to the semiconductor element pads 21 of the wiring board 2. Then, the underfill resin 4 is filled between the wiring board 2 and the semiconductor element 3, which are flip-chip-connected, and then hardened. The above manufacturing processes manufacture the lower package 1 of the present embodiment.

Figure 7A:
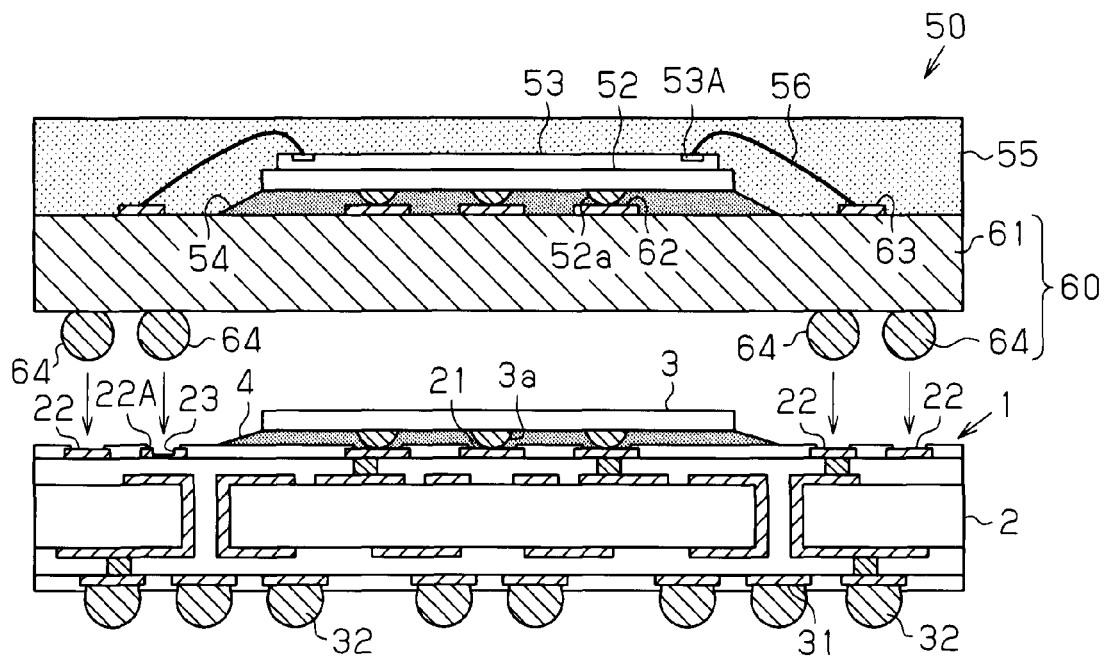
FIGS. 7A and 7B are schematic cross-sectional views illustrating the procedures for manufacturing the semiconductor device.

Next, referring to FIG. 7A, the upper package 50 is prepared. The manufacturing of the upper package 50 is not illustrated in the drawings and will not be described below in detail. The upper package 50 is manufactured, for example, as described below. The wiring board 60 is formed including the semiconductor element pads 62, the bonding pads 63, and the external connection terminals 64. The bumps 52a of the first semiconductor element 52 are flip-chip-connected to the semiconductor element pads 62 formed on the upper surface of the wiring board 60. Then, after the underfill resin 54 is formed between the wiring board 60 and the first semiconductor element 52, the second semiconductor element 53 is adhered to the first semiconductor element 52 with an adhesive agent. Further, the electrode pads 53A formed on the upper surface of the second semiconductor element 53 are wire-bonding-connected to the bonding pads 63 formed on the upper surface of the wiring board 60 with the bonding wires 56. Then, the semiconductor elements 52 and 53, the bonding wires 56, and the like are sealed with the molding resin 55.

Next, the upper package 50 is stacked on and connected to (mounted on) the lower package 1. The procedures of the mounting will now be described in detail.

First, the lower package 1 is accommodated in a carrier (not illustrated). A camera (not illustrated), which is arranged at a fixed point, captures images of the surface (upper surface) of the accommodated lower package 1. Here, the image captured by the camera undergoes image processing, and the locations of the recognition marks 23 formed in the connection pads 22A of the lower package 1 are detected. The type of the lower package 1 is identified from the locations of the two recognition marks 23. When the lower package 1 is identified as not being the desired type (product), the lower package 1 is not mounted on the upper package 50. In this case, an error message is generated when necessary.

When the lower package 1 is identified as being the desired type (product), the position of the lower package 1 is recognized from the detected locations of the recognition marks 23. Referring to FIG. 7A, based on the location of the recognized lower package 1, the external connection terminals 64 of the upper package 50 are aligned with the connection pads 22 and 22A of the lower package 1. In this state, flux (not illustrated) is transferred to the external connection terminals 64 of the upper package 50.

Figure 7B:
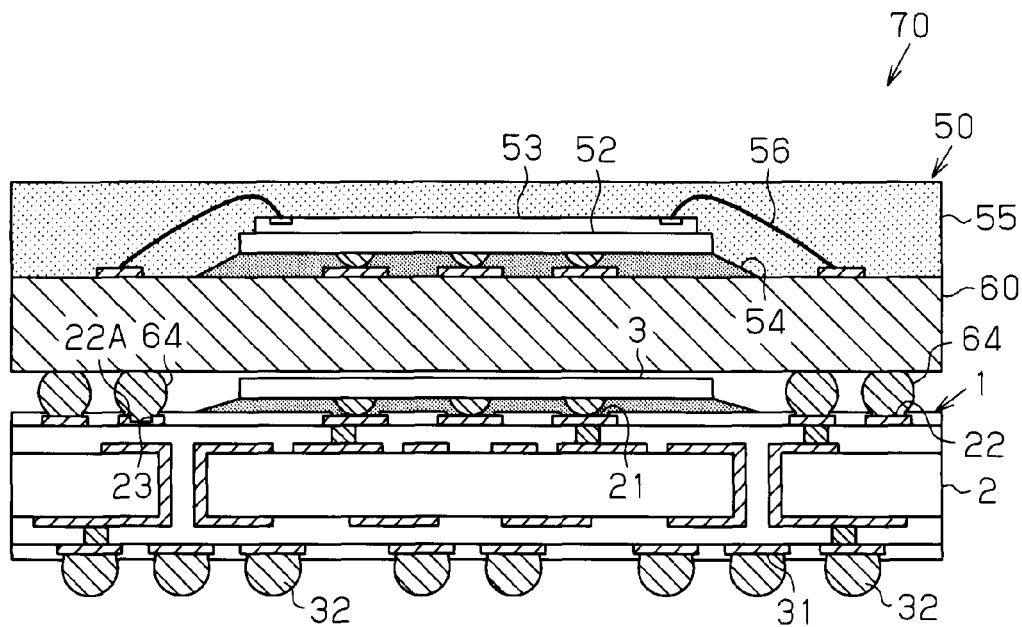

Then, when the upper package 50 is aligned with and placed on the lower package 1, which is set in the carrier, the carrier is transported to a reflow furnace (not illustrated). In the reflow furnace, the external connection terminals 64 (solder balls) undergo a reflow process. This connects the lower package 1 and the upper package 50 at the connection pads 22 and 22A. In this manner, the semiconductor device 70 having a PoP structure is manufactured as illustrated in FIG. 7B.

The present embodiment has the advantages described below.

(1) In the lower package 1, among the connection pads 22, at least the two connection pads 22A include the recognition marks 23. Each recognition mark 23 has a shape as viewed from above that is smaller than that of the corresponding connection pad 22A. In other words, the area of each recognition mark 23, as viewed in a direction perpendicular to the substrate 10, is smaller than that of the corresponding connection pad 22A. This allows the connection pads 22A to be provided with recognition marks, and there is no need to provide space dedicated for the formation of a recognition mark. Further, each recognition mark 23 is formed within the region of the corresponding connection pad 22A. This allows the shape of the connection pads 22A as viewed from above to be the same as that of the other connection pads 22. Thus, the connection pads 22A having the recognition mark function can have a shape (e.g., circular shape) that allows for application to highly dense wires.

(2) The recognition marks 23 are formed to have a smaller shape as viewed from above than the connection pads 22 and 22A, that is, to have a shape that differs from the connection pads 22 and 22A. Thus, when detecting the recognition marks 23 with a camera or the like, the recognition marks 23 can easily be distinguished from the connection pads 22 and 22A. This allows for easy detection (recognition) of the location of the recognition mark 23.

(3) The recognition marks 23 are formed by the recesses 20X in the wiring pattern 20. That is, the contour (profile) of a recognition mark 23 is formed by a step. This obtains a contrast between the recognition mark 23 and the upper surface of the connection pad 22A when detecting the recognition mark 23 with a camera or the like. Thus, the contour of the recognition mark 23 is easy to recognize, and the recognition of the recognition mark 23 is ensured. Accordingly, when mounting the upper package 50 on the lower package 1, the lower package 1 is located with higher accuracy.

Further, even when the recognition mark 23 occupies most of the corresponding connection pad 22A, the recognition mark 23 is formed in the wiring pattern 20. Thus, the area of the surface of the wiring pattern 20 that is coupled to the external connection terminals 64 of the upper package 50 can be ensured in the same manner as the connection pads 22. This prevents the coupling strength from decreasing between the connection pad 22A and the external connection terminal 64.

It should be apparent to those skilled in the art that the present invention may be embodied in many other specific forms without departing from the spirit or scope of the invention. Particularly, it should be understood that the present invention may be embodied in the following forms.

Figure 8A:
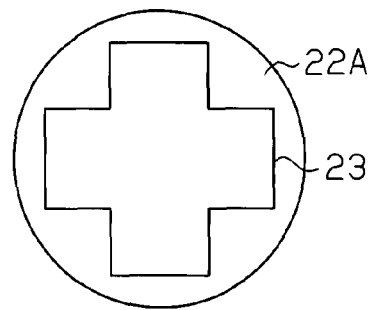
FIGS. 8A to 8C are schematic plan views illustrating recognition marks in modifications.
Figure 8B:
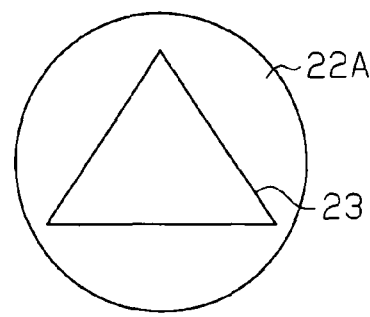
Figure 8C:
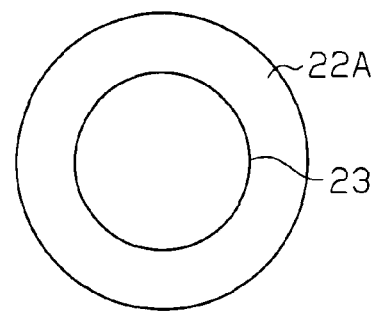

In the above embodiment, the recognition marks 23 have a tetragonal shape as viewed from above but are not limited in such a manner. For example, when viewed from above, the recognition marks 23 may have a cross-like shape (refer to FIG. 8A), a triangular shape (refer to FIG. 8B), or a circular shape (refer to FIG. 8C). When the recognition marks 23 and the connection pads 22 and 22A all have circular shapes, the recognition marks 23 are formed to be smaller than the connection pads 22 and 22A so that the difference in area of the recognition marks 23 from the connection pads 22 and 22A allows for the recognition marks 23 to be distinguished from the connection pads 22 and 22A. In this manner, as long as the recognition mark 23 allows the connection pads 22 and 22A to be distinguished, the shape of the recognition mark 23 is not particularly limited. For example, the recognition mark 23 when viewed from above may be X-shaped or minus-sign-shaped.

In the above embodiment, the recognition marks 23 are formed by the recesses 20X, which are arranged in parts exposed form the wiring pattern 20 as the connection pads 22A. Instead, for example, projections may be formed on parts exposed from the wiring pattern 20 as the connection pads 22A, and the projections may be used as the recognition marks 23.

In the above embodiment, the recognition marks 23 are formed by reducing the thickness of the wiring pattern 20 in parts exposed from the wiring pattern 20 as the connection pads 22A. Instead, for example, referring to FIG. 8D, the underlying insulative layer 12 may be exposed from the wiring pattern 20 as the recognition mark 23 by removing parts of the wiring pattern 20 exposed as the connection pads 22A. In this case, the boundary of the recognition mark 23 is formed by the insulative layer 12 and the wiring pattern 20, which are made of different materials. Thus, when detecting the recognition mark 23 with a camera or the like, the contour of the recognition mark 23 is easier to recognize. This ensures recognition of the recognition mark 23 and increases the accuracy for locating the lower package 1 when mounting the upper package 50 on the lower package 1. However, in this case, it is preferable that the removed parts of the wiring pattern 20 be minimized in view of the coupling strength with the external connection terminals 64 of the upper package 50.

Figure 8D:
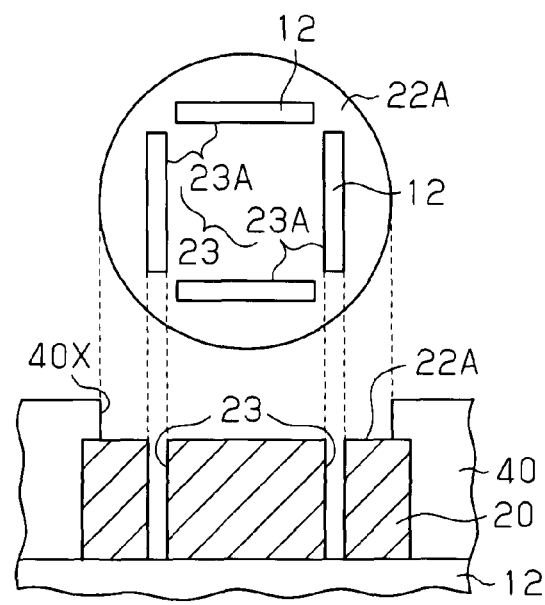
FIG. 8D is a schematic plan view and schematic cross-sectional view illustrating a recognition mark in a modification.
Figure 9:
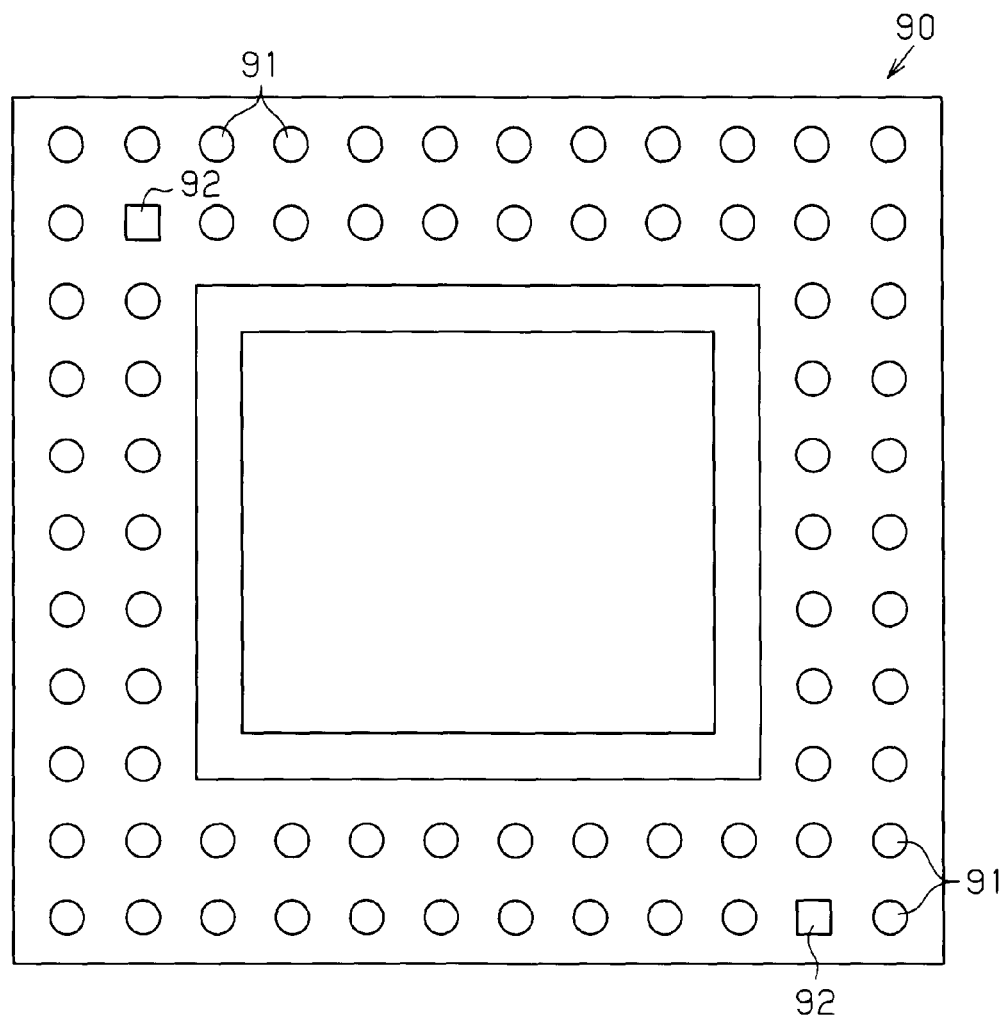
FIG. 9 is a schematic plan view illustrating a semiconductor package of the prior art.

In FIG. 8D, in the part exposed from the wiring pattern 20 as the connection pad 22A, the wiring pattern 20 is removed in four aperture regions (slits) 23A, which have a linear shape as viewed from above. The four aperture regions 23A are arranged in a tetragonal layout in the connection pad 22A as viewed from above. The shape formed by the combination of the four aperture regions 23A functions as the recognition mark 23.

The number and location of the connection pads 22A of the above embodiment, that is, the connection pads 22A including the recognition marks 23 is not particularly limited. More specifically, there may be three or more connection pads 22A. In the above embodiment, the connection pads 22A are arranged along a diagonal line of the lower package 1. However, for example, the connection pads 22A may be arranged at locations forming a triangle as viewed from above in the lower package 1.

In the wiring board 2 of the lower package 1 of the above embodiment, the configuration of layers under the wiring patterns 20 and 30 are not particularly limited. For example, the configuration and material of the core substrate 11 are not particularly limited. Further, the number of the layers forming insulative layers (e.g., insulative layers 12 and 13) covering the underlying wires formed on the core substrate 11 (e.g., wires 14 and 15) is not particularly limited. Also, a coreless substrate may be used as the substrate 10.

In the above embodiment, the external connection terminals 32 are formed on the wiring board 2 of the lower package 1. However, the external connection terminals 32 can be omitted. That is, parts of the wiring pattern 30 may be left exposed from the solder resist layer 41 as the external connection pads 31 so that the external connection terminals 32 or the like can be formed when necessary.

In the upper package 50 of the above embodiment, semiconductor elements are stacked in a configuration that employs both flip-chip connection and wire-bonding connection. However, the present invention is not limited in such a manner. When stacking the second semiconductor element 53 on the first semiconductor element 52, the two semiconductor elements 52 and 53 may both be wire-bonding-connected. Alternatively, the two semiconductor elements 52 and 53 may both be flip-chip-connected. Further, just one semiconductor element may be mounted on the wiring board.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment of the present invention has been described in detail, it should be understood that the various changes, substitutions, and alterations could be made hereto without departing from the spirit and scope of the invention.

The invention claimed is:

1. A semiconductor device comprising:
   a lower package comprising:
      a wiring pattern including exposed parts that function as a plurality of connection pads; and
      a recognition mark formed in each of at least two of the plurality of connection pads, wherein each said recognition mark has an area less than an area of the corresponding connection pad when viewed from above, and wherein each said recognition mark is a recess or a projection of the corresponding exposed part of the wiring pattern in an outermost surface of the lower package; and
   an upper package comprising connection terminals configured to be electrically connected to at least some of the plurality of connection pads.

2. The semiconductor device according to claim 1, further comprising:
   an insulative layer;
   wherein the wiring pattern is formed on the insulative layer, and
   wherein each said recognition mark includes aperture regions that are formed in the corresponding exposed parts of the wiring pattern to expose the insulative layer underneath the wiring pattern.

3. The semiconductor device according to claim 1, wherein the recognition mark includes an etched surface or pressed surface formed in exposed part of the wiring pattern and serving as at least the two connection pads.

4. The semiconductor device according to claim 1, wherein
   the plurality of connection pads each have a circular planar shape, and
   the recognition mark has a planar shape that differs from the planar shape of the plurality of connection pads.

5. The semiconductor device according to claim 1, wherein the recognition marks formed in at least two of the plurality of connection pads indicate the type of the lower package.

6. The semiconductor device according to claim 1, wherein the exposed parts are adapted to be directly connected to the connection terminals of the upper package.

7. The semiconductor device according to claim 1, wherein the exposed parts are pad surfaces of the plurality of connection pads, the pad surfaces being identical in shape.

8. A semiconductor device comprising:
   a lower package comprising:
      a substrate;
      a wiring layer including a plurality of connection pads formed on the substrate and including marked connection pads and non-marked connection pads in an outermost surface of the lower package, wherein the marked connection pads and the non-marked connection pads have the same shape and the same area, as viewed in a direction perpendicular to the substrate; and
      recognition marks respectively formed in the marked connection pads, each said recognition mark having an area less than an area of the corresponding marked connection pad when viewed from above, wherein each said recognition mark is a recess or a projection of the wiring pattern in the outermost surface of the lower package; and an upper package comprising connection terminals configured to be electrically connected to at least some of the plurality of connection pads.

9. The semiconductor device according to claim 8, further comprising:

a solder resist layer including a plurality of openings respectively corresponding to the plurality of connection pads;

wherein each said recognition mark is arranged within the corresponding opening.

10. The semiconductor device according to claim 9, wherein each said recognition mark has a contour that is entirely arranged within the corresponding opening.

11. The semiconductor device according to claim 9, wherein the recognition mark is smaller than corresponding opening.

12. The semiconductor device according to claim 9, wherein the recognition mark and the corresponding opening have different contours.

13. The semiconductor device according to claim 9, wherein the lower package is a polygon, and two of the marked connection pads are respectively arranged proximal to two opposing corners of the polygon.

14. The semiconductor device according to claim 8, wherein the recognition marks indicate the type of the lower package.

* * * * *